US006563754B1

(12) United States Patent  
Lien et al.

(10) Patent No.: US 6,563,754 B1  
(45) Date of Patent: May 13, 2003

(54) DRAM CIRCUIT WITH SEPARATE REFRESH MEMORY

(75) Inventors: Chuen-Der Lien, Los Altos Hills; Chau-Chin Wu, Cupertino, both of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 298 days.

(21) Appl. No.: 09/781,524

(22) Filed: Feb. 8, 2001

(51) Int. Cl.[7] ................................................. G11C 7/00
(52) U.S. Cl. ..................... 365/222; 365/230.03; 365/49
(58) Field of Search .............................. 365/222, 230.03, 365/49, 203

(56) References Cited

U.S. PATENT DOCUMENTS

| | | | | |
|---|---|---|---|---|
| 3,665,422 A | * | 5/1972 | McCoy et al. | 365/222 |
| 5,642,320 A | | 6/1997 | Jang | 365/222 |
| 5,796,671 A | * | 8/1998 | Wahlstrom | 365/230.03 |

* cited by examiner

*Primary Examiner*—Huan Hoang  
(74) *Attorney, Agent, or Firm*—Bever, Hoffman & Harms LLP (57) ABSTRACT

A DRAM circuit including a first DRAM array used solely for refresh operations, and the second DRAM array for performing logic operations that is refreshed using data read from the first DRAM array. Specifically, data is read only from the first DRAM array during a read phase of the refresh operation, and is written to both the first DRAM array and the second DRAM array during the write phase of the refresh operation. Accordingly, the second DRAM array is able to simultaneously perform any type of logic operation without delay or disturbance caused by accessing the second DRAM array during the read phase. In one embodiment, the second DRAM array includes DRAM CAM cells that perform data matching operations using the data refreshed from the first DRAM array, which includes conventional DRAM memory cells. During read operations, because the data values stored in the first DRAM array and the second DRAM array are identical, data values are read from the conventional DRAM memory cells of the first DRAM array, instead of from the DRAM CAM cells.

20 Claims, 3 Drawing Sheets

DRAM CIRCUIT WITH SEPARATE REFRESH MEMORY

FIELD OF THE INVENTION

The present invention relates to content addressable memory (CAM) arrays. More specifically, the present invention relates to dynamic random-access-memory (DRAM) CAM arrays.

DISCUSSION OF RELATED ART

Semiconductor memory devices fall into two broad categories: read only memory (ROM) devices, and read-write or "random access" memory (RAM) devices. ROM (e.g., EPROM or EEPROM) devices are non-volatile devices primarily used to store data when system power is turned off. In contrast, RAM devices temporarily store data that is used during system operation. RAM devices are typically volatile in that the data stored in a RAM device is lost when power is turned off. RAM devices are roughly divided into two types: static random access memory (SRAM) devices, and dynamic random access memory (DRAM) devices.

An SRAM device consists of a basic bistable flipflop circuit that needs only an applied DC current to retain a data value. To store a logic "1" data value (bit), the bistable flipflop is biased into a first stable state, and to store a logic "0" data value, the bistable flipflop is biased into its second stable state. The bistable flipflop maintains the first or second stable state until an opposite biasing voltage is applied that "flips" the bistable flipflop from the first to the second (or the second to the first) stable state. While this stable data storage provides certain advantages, a main disadvantage of SRAM cells is their relatively large size due to the multiple (typically six or more) transistors required to form and access the bistable flipflop circuit.

In contrast to SRAM cells, a DRAM cell stores a data value as a charge on a capacitor or wire. The main advantage of most DRAM cells is that the basic DRAM memory cell requires only a single transistor and a capacitor, thereby making DRAM cells significantly smaller and less expensive to produce than SRAM cells. Other DRAM memory cells include several transistors and are able to store a data value without special fabrication steps needed to produce the capacitor of the single transistor cell. The main disadvantage of DRAM cells is that the stored data values decay over time, thereby requiring refresh circuitry that reads and rewrites (refreshes) the stored data values before they are lost. The time required to perform this refresh operation often reduces the effectiveness of any logic operation that utilizes the data values stored in the DRAM cells.

Conventional RAM arrays include RAM cells arranged in rows and columns, and addressing circuitry that accesses a selected row of RAM cells using address data corresponding to the physical address of the RAM cells. That is, data words stored in the rows of conventional RAM cells are accessed by applying address signals to the RAM array input terminals. In response to each unique set of address signals, a RAM array outputs a data word that is read from a portion of the RAM array designated by the address.

Unlike conventional RAM arrays, content addressable memory (CAM) arrays include memory cells that are addressed in response to their content, rather than by a physical address within a RAM array. Specifically, a CAM array receives a data value that is compared with all of the data values stored in the rows of the CAM array. In response to each unique data value applied to the CAM array input terminals, the rows of CAM cells within the CAM array assert or de-assert associated match signals indicating whether or not one or more data values stored in the CAM cell rows match the applied data value. CAM arrays are useful in many applications, such as search engines.

Similar to conventional RAM devices, CAM devices can either be formed as DRAM CAM devices, in which data values are stored using capacitors, or SRAM CAM devices, in which data values are stored using bistable flipflop circuits. Also similar to conventional RAM devices, DRAM CAM devices provide an advantage in that they are typically smaller than SRAM CAM devices.

Figure 1A:
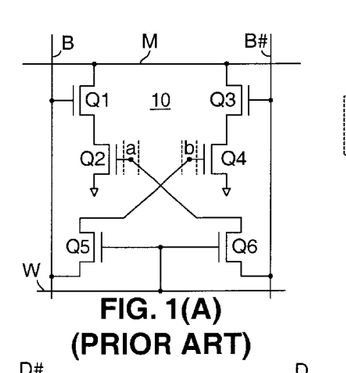
FIG. 1(A) is a schematic diagram showing a prior art single-port DRAM CAM cell.

FIG. 1(A) is a circuit diagram showing a conventional dynamic (DRAM) CAM cell 10, which is formed by six transistors Q1 through Q6. During a data write operation (or during the write phase of a refresh operation), a data value to be stored is written to dynamic storage nodes a and b (depicted by dashed capacitive plates) by applying a true (e.g., logic "1" or VCC) data signal and a complement (e.g., logic "0" or ground) data signal to bit lines B and B# (the "#" is used herein to designate complement), and then applying a high voltage signal on word line W. The high voltage on word line W turns on transistor Q5 and Q6, thereby passing the data signals to dynamic storage nodes a and b.

Subsequent to storing a data value in DRAM CAM cell 10, a match (comparison) operation is performed by pre-charging a match line M and transmitting a data value to be compared onto bit lines B and B#. A no-match condition is detected when match line M is discharged to ground through the signal path formed by transistors Q1 and Q2, or through the signal path formed by transistors Q3 and Q4. For example, when the stored data value at node a and the applied data value transmitted on bit line B are both logic "1", then both transistors Q1 and Q2 are turned on to discharge match line M to ground. When a match condition occurs, match line M remains in its precharged state (i.e., no signal path is formed by transistors Q1 through Q4).

A first problem with DRAM CAM cell 10 is that, in order to refresh the dynamic storage nodes a and b, a refresh cycle must be inserted between the match operations. This refresh operation requires turning on the word line W such that the data values stored at dynamic nodes a and b are applied to bit lines B and B# through transistors Q5 and Q6, sensing the data values on bit lines B and B#, and then rewriting these sensed data values back to dynamic nodes a and b through transistors Q5 and Q6. Because the bit lines B and B# are used during the refresh operation and during "logic" (i.e., match) operations, the match operations are undesirably delayed until the refresh operation is completed, thereby making performance of DRAM CAM cell 10 undesirably slow.

A second problem associated with DRAM CAM cell 10 is that, even if separate bit lines are provided to allow simultaneous refresh and match operations, the read phase of the refresh operation can be disturbed by the simultaneous match operation. When conventional DRAM cells are read, the read data values are typically transmitted to associated bit lines during "quite" periods in which switching noise in a DRAM array does not cause a loss of the read data values. However, by allowing simultaneous match operations during the read phase of the refresh operation, it is possible to lose the read data values. Accordingly, providing separate bit lines does not necessarily facilitate simultaneous read and match operations.

A third problem associated with DRAM CAM cell 10 is that, due to the read phase of the refresh operation, the number of cells in each column of a DRAM CAM array must be minimized. That is, the length and, hence, the capacitance of bit lines B and B# increases with the number of DRAM CAM cells arranged in a column that are connected to these lines. Because the data values are partially decayed before being transmitted from each DRAM CAM cell onto bit lines B and B#, this capacitance can generate read phase errors if bit lines B and B# are too long. By limiting the number of DRAM CAM cells in each column, the number of independent blocks of DRAM memory cells is increased, thereby requiring more space for control circuitry and increasing the overall size and cost of the DRAM CAM circuit.

Figure 1B:
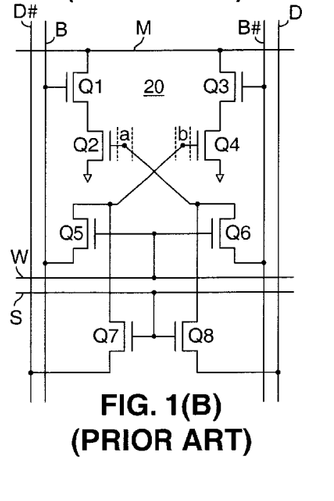
FIG. 1(B) is a schematic diagram showing a prior art dual-port DRAM CAM cell.

FIG. 1(B) is a circuit diagram showing a dual port DRAM CAM cell 20 that is disclosed in U.S. Pat. No. 5,642,320. Dual port DRAM CAM cell 20 overcomes the first problem described above by providing a seventh transistor Q7 and an eight transistor Q8 that are connected to a second set of dedicated lines (i.e., data lines D and D#), and are turned on by a select line S during refresh operations. Accordingly, match operations and refresh operations can be performed simultaneously. However, dual port DRAM CAM cell 20 fails to address the second and third problems (discussed above) in that, because data is read from dynamic nodes a and b during the read phase of the refresh operation, this data can be disturbed by simultaneously performed match operations. Further, the required read phase of the refresh operation limits the number of cells in each column for the reasons explained above, thereby increasing overall size and cost of a CAM circuit made up of DRAM CAM cells 20.

Accordingly, what is needed is a DRAM circuit in which logic operations are not delayed or otherwise disrupted by the refresh operation.

SUMMARY

The present invention is directed to DRAM circuits that overcome the problems associated with conventional DRAM circuits (e.g., DRAM CAM arrays) by providing first and second associated DRAM arrays that store essentially identical data values. The first DRAM array is used solely for refresh operations (and data read operations), and the second DRAM array is utilized to perform logic operations (e.g., match operations). During the read phase of a refresh operation, data values are read only from the first DRAM array by a refresh circuit, and during a subsequent write phase of the refresh operation, data values are written from the refresh circuit to both the first and the second DRAM arrays. Because data values are only written to (not read from) the second DRAM array, logic operations performed using the second DRAM array are not delayed or otherwise disrupted during the read phase of the refresh operation. Accordingly, the present invention avoids the problems associated with conventional DRAM arrays.

In addition, because the data values stored in the first DRAM array are copied into the second DRAM array, the data stored in the second DRAM array can be read during read operations without interrupting other logic functions by reading the data stored in the first DRAM array. Write operations are performed by simultaneously transmitting a data value to associated dram cells located in both the first and second DRAM arrays.

In accordance with a disclosed specific embodiment of the present invention, a DRAM CAM circuit includes a DRAM CAM array for performing match (comparison) operations, and an associated DRAM memory array that stores the same data values stored in the DRAM CAM array. Data values are read from the DRAM memory array during a read phase of a refresh operation, and then written both to the DRAM memory array and to a DRAM CAM array during a write phase of the refresh operation. Accordingly, the DRAM CAM array is continuously refreshed without reading the data values stored in the DRAM CAM array during the refresh operation. Further, the data values written from the refresh circuit to the DRAM CAM array are transmitted on dedicated bit lines, thereby allowing the simultaneous performance of data match operations by the DRAM CAM array. Moreover, by utilizing a separate DRAM memory array to refresh the DRAM CAM cell, the size of each DRAM CAM cell is minimized, thereby minimizing the length of, for example, the match lines, thereby reducing capacitance and power loss.

The present invention will be more fully understood in view of the following description and drawings.

DETAILED DESCRIPTION

The present invention is described below with reference to a generalized embodiment (FIG. 2), and to three specific embodiments (FIGS. 3–6). Each of these embodiments includes one or more "DRAM cells" and performs one or more "logic operations". As used herein, the term "DRAM cell" generally refers to any type of memory cell that utilizes DRAM technology (e.g., a conventional DRAM memory cell, or a DRAM CAM cell). In contrast, the term "DRAM memory cell" refers to, for example, one or more single transistor (1T) memory cell and capacitor structures, such as those discussed above, that temporarily store data values using the capacitor of each structure. Alternatively, the term "DRAM memory cell" refers to other conventional multi-transistor (e.g., 3T) memory cells utilizing DRAM technology to temporarily store data values. Further, the term "DRAM CAM cell" specifically refers a CAM cell utilizing DRAM technology. Note that the general term "DRAM cell" is not limited to DRAM memory cells and DRAM CAM cells. In addition, as used herein, the term "logic operation" generally refer to logic performed using data stored by DRAM cells. For example, with the DRAM cell is a CAM cell, the logic operation performed may be a match operation. Alternatively, when the DRAM cell is a conventional memory cell, the logic operation may include controlling a pass transistor utilized in a dedicated logic circuit. An example of such a logic operation is disclosed in co-owned and co-pending U.S. application Ser. No. 09/780,714, entitled "TERNARY CAM CELL WITH DRAM MASK CIRCUIT" [IDT-1649], which is incorporated herein in its entirety.

Figure 2:
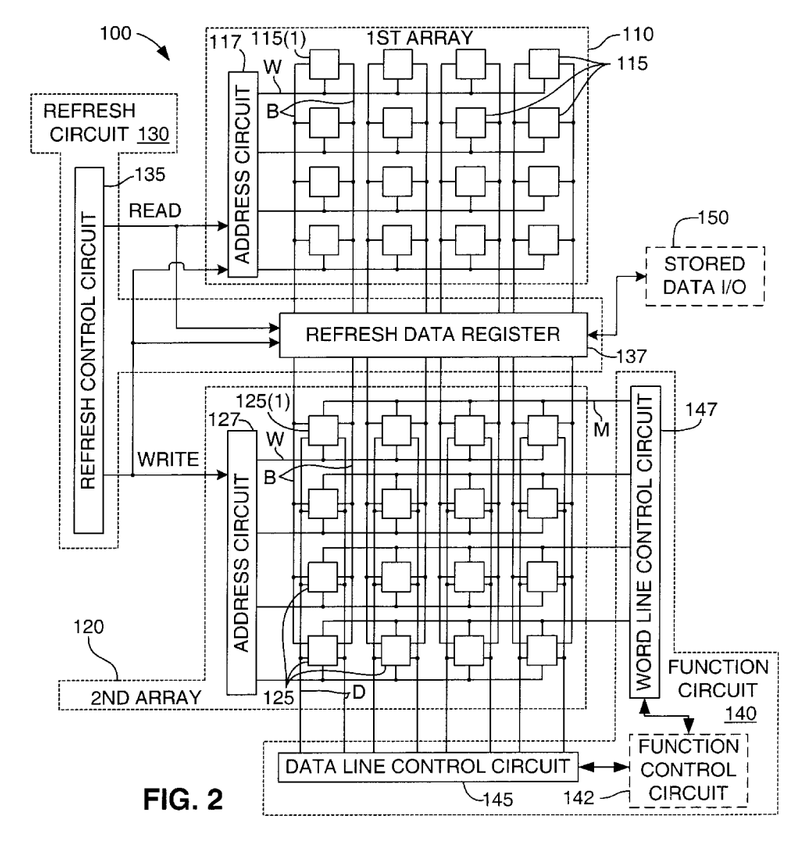
FIG. 2 is a block diagram showing a simplified DRAM circuit in accordance with the present invention.

FIG. 2 is a block diagram showing a simplified DRAM memory circuit 100 in accordance with a general embodiment of the present invention. DRAM memory circuit 100 includes a first array 110 of DRAM cells 115, a second array 120 of DRAM cells 125, a refresh circuit 130, and a function circuit 140. Refresh circuit 130 is coupled to both first array 110 and second array 120 by bit lines B, and function circuit 140 is coupled to second array 120 by separate data lines D. As described in additional detail below, refresh circuit 130 is controlled such that data values are only read from first array 110 during a read phase of a refresh operation, whereas the data values are written to both first array 110 and second array 120 during a write phase of the refresh operation. In addition, each DRAM cell 115 of first array 110 is associated with a DRAM cell 125 of second array 120 such that the data value read from each DRAM cell 115 is written into its associated DRAM cell 125. For example, during the read phase, a data value is read from a first DRAM cell 115(1) of first array 110 and temporarily stored by refresh circuit 130, and then, during the subsequent write phase of the refresh operation, the data value is written from refresh circuit 130 to first DRAM cell 115(1) of first array 110, and to an associated second DRAM cell 125(1) of second array 120. Accordingly, at the end of the refresh operation, both first array 110 and second array 120 store essentially identical information (note the exception associated with quad CAM cells, discussed below). Note that the data values are written to second array 120 using bit lines B during the write phase of the refresh operation, and data lines D are free to perform simultaneous logic operations using the data stored in second array 120.

As discussed in the background section (above), DRAM cells require a refresh operation to maintain stored data. The time required to perform this refresh operation often reduces the effectiveness of any logic operation that utilizes the data values stored in the DRAM cells. Further, during the read phase of a refresh operation, the DRAM cells can be disturbed (i.e., the stored data can be changed) by noise generated by simultaneous performance the logic operation. Moreover, the read phase of the refresh operation typically minimizes the number of DRAM cells in each block of DRAM cells (i.e., the number off DRAM cells in each column).

In accordance with the present invention, DRAM memory circuit 100 provides the size and power advantages associated with DRAM circuitry, while avoiding the problems associated with conventional DRAM cells by performing the read phase of the refresh operation using only first array 110 while performing logic operations using only second array 120. First, by providing separate bit lines B and data lines D for refresh and logic operations, respectively, second array 120 maximizes the effectiveness of the logic operation performed by DRAM circuit 100. Second, because data is only written to (i.e., not read from) second array 120 during the refresh operation, logic operations can be simultaneously performed by second array 120 without risking disturbance by noise generated during the read phase of a refresh operation. Moreover, because the read phase of the refresh operation is omitted from second array 120, the limitations associated with conventional DRAM circuits on the number of DRAM cells 120 in each block (i.e., column) is avoided.

Referring to FIG. 2, DRAM cells 115 of first array 110 are arranged in rows and columns, and are coupled to an address circuit 117 and to refresh circuit 130. Each row of DRAM cells 115 is connected to an associated write line W, and is addressed during read and write operations by an address signal transmitted from address circuit 117 in accordance with known techniques. Each column of DRAM cells 115 is connected to one or more associated bit lines B, which are used to transmit data values to and from refresh circuit 130 in the manner described below.

DRAM cells 125 of second array 120 are also arranged in rows and columns, and are coupled to an address circuit 127, to refresh circuit 130, and to function circuit 140. Each row of DRAM cells 125 is connected to an associated write line W, and is addressed during read and write operations by an address signal transmitted from address circuit 127 in accordance with known techniques. Each row of DRAM cells 125 is also connected to an associated match (word) line M, which is controlled by function circuit 140 during logic operations (described below). Each column of DRAM cells 125 is connected to one or more associated bit lines B, which are used to transmit data values from refresh circuit 130 to rows of DRAM memory cells addressed by address circuit 127. In addition, each column of DRAM cells 125 is connected to one or more associated data lines D, which are controlled by function circuit 140 and used to transmit data values during the performance of logic operations by DRAM circuit 100.

Referring to the left side of FIG. 2, refresh circuit 130 includes a refresh control circuit 135 and a refresh data register 137. Refresh control circuit 135 transmits control signals to first array 110, second array 120, and refresh data register 137 to coordinate the read phase and write phase of the refresh operation. Note that control circuit 135 transmits a READ control signal only to first array 110 and refresh data register 137 (i.e., not to second array 120), while WRITE control signals are transmitted to first array 110, second array 120, and refresh data register 137. Note that the particular row of DRAM cells 115 and DRAM cells 125 addressed in response to the READ and WRITE control signals is controlled by a counter provided in address circuits 117 and 127, respectively. In other embodiments, refresh control circuit may generate address data in addition to the READ and WRITE control signals. In yet other embodiments, separate READ and WRITE control signals may be omitted by synchronizing the read and write phases of the refresh operation. Refresh data register 137 senses and temporarily stores data values read from an addressed row of first array 110 during the read phase, and then transmits these data values back to the addressed row of first array 110 and to a corresponding row in second array 120.

In the embodiment shown in FIG. 2, function circuit 140 is depicted as including a function control circuit 142, a data line control circuit 145, and a word (or match) line control circuit 147. Function control circuit 142 serves to generate necessary control signals and to transfer data signals to and from data line control circuit 145, which serves to read data values from or apply data values to selected DRAM cells 125 during logic operations, and word line control circuit 147, which serves to apply address signals to or read control signals from selected rows of DRAM cells 125. For example, in a specific embodiment described below, function circuit 140 performs CAM operations in which applied data values are transmitted on data lines D, and match lines M carry match signals indicating whether or not the applied data signal values match the data values stored in second array 120. However, although described below with reference to CAM logic operations, function circuit 140 is not necessarily limited to CAM operations.

Referring to the right side of FIG. 2, an optional stored data input/output (I/O) circuit 150 is connected to refresh circuit 130 that allows data to be read from or written to (stored in) first array 110 and second array 120 from an external source via refresh circuit 130. Alternatively, this functions of reading data from and writing data to DRAM memory circuit 100 can be performed using other dedicated circuit structures (not shown). In accordance with another aspect of the present invention, because the data values stored in first array 110 is essentially identical to that stored in second array 120, read operations are performed by reading data values from first array 110, although the read operation can also be performed by reading from second array 120. During write operations, data values are simultaneously transmitted both to a DRAM cell in first array 110 and its corresponding DRAM cell in second array 120.

Figure 3:
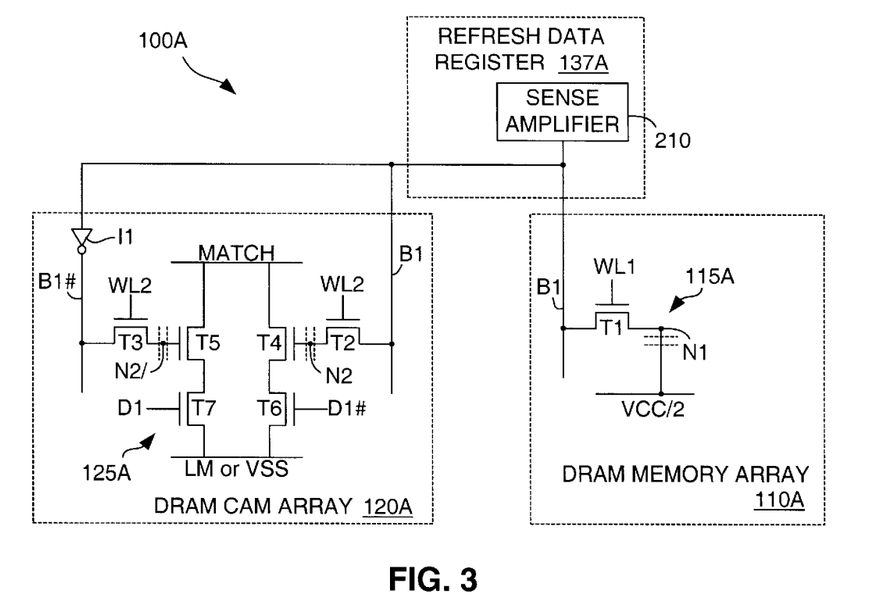
FIG. 3 is a simplified schematic diagram showing a binary DRAM CAM array according to a first specific embodiment of the present invention.

FIG. 3 is a simplified circuit diagram showing portions of a binary DRAM circuit 100A in accordance with a first specific embodiment of the present invention. In the first specific embodiment, the logic operation performed by binary DRAM circuit 100A is a binary CAM "match" operation in which applied data values are compared with a stored data value (either logic "1" or logic "0"), and a match signal is generated that indicates whether or not the applied data value matches the stored data value. Binary CAM functions are well known.

Consistent with generalized DRAM circuit 100 (shown in FIG. 2), DRAM circuit 100A includes a DRAM memory (first) array 110A, a DRAM CAM (second) array 120A, a refresh circuit including a refresh data register 137A, and a function circuit (not shown). Portions of DRAM circuit 100A that are not required for explanatory purposes are omitted for brevity.

Referring to the lower right portion of FIG. 3, DRAM memory circuit 110A includes an array of conventional DRAM memory cells 115A (one shown) that are arranged in rows and columns (as shown in FIG. 2). Each DRAM memory cell 115A includes a transistor T1 having a gate terminal connected to an associated word line (e.g., word line WL1), a first terminal connected to an associated bit line (e.g., bit line B1), and a second terminal connected to a signal source (e.g., VCC/2 or ground). Data values written to each DRAM memory cell 115A are stored at a storage node N1, which includes a capacitor (indicated by dashed parallel plates) that is formed between the second terminal of transistor T1 and the signal source for temporarily storing the data value according to known DRAM techniques.

Referring to the lower left portion of FIG. 3, DRAM CAM array 120A includes an array of DRAM CAM cells 125A (one shown) that are arranged in rows and columns. Each DRAM CAM cell 125A includes access transistors T2 and T3 that are connected between complementary storage nodes N2 and N2# and complementary bit lines B1 and B1#, respectively, and series connected transistors T4 through T7 that form two signal paths between a match control line M and a low match control line LM. Note that, during operation, storage node N2 stores the same data value as that stored at node N1 of DRAM memory cell 115A, and inverted storage node N2# stores the complement (inverse) of the data value stored at storage node N2.

Access transistors T2 and T3 are utilized to pass data values from refresh data register 137A to storage nodes N2 and N2# during the write phase of a refresh operation. First access transistor T2 is connected between bit line B1 and storage node N2, and second access transistor T3 is connected between an inverted bit line B1# and inverted storage node N2#. Note that inverted bit line B1# is coupled to bit line B1 through an inverter I1 such that the inverse of the data signal transmitted on bit line B1 is applied to inverted bit line B1#. Therefore, the data value stored at inverted storage node N2# (e.g., logic "0") is the inverse of the data value stored at (non-inverted) storage node N2 (e.g., logic "1"). The gate terminals of first access transistor T2 and second access transistor T3 are connected to a second word line WL2, which is controlled by address circuit 127 (see FIG. 2).

Transistors T4–T7 form parallel signal paths between a match control line M and a low match control line LM. During match operations, match control line M is used to indicate when an applied data value transmitted on data lines D and D# matches the data value stored at storage nodes N2 and N2#. In particular, transistor T4 is connected between match control line M and transistor T6, which in turn is connected to low match control line LM. The gate terminal of transistor T4 is connected to and controlled by the data value stored at storage node N2, and the gate terminal of transistor T6 is connected to and controlled by inverted data line D#. Similarly, transistor T5 is connected between match control line M and transistor T7, which has a lower terminal connected to low match control line LM, and the gate terminals of transistors T5 and T7 are respectively connected to third node N2# and a data line D. Data line D carries the applied data value, and inverted data line D# carries an inverse of the applied data value. Match control line M is controlled by a portion of word line control circuit 147 (see FIG. 2) such that it floats during non-active periods, and is pulled up to a pre-determined high voltage (e.g., VCC) during match operations. Similar to match control line M, low match control line LM is controlled by a portion of word line control circuit 147 (see FIG. 2) such that it floats during non-active periods, and is pulled down to a pre-determined low voltage (e.g., ground or VSS) during match operations. For example, during a standby operation in which the comparator circuits of CAM cell 125A connected to low match control line LM are not active, low match control line LM is allowed to float, thereby conserving power. However, during a match operation, low match control line LM is maintained at a predetermined logic voltage level by word line control circuit 147. As a result, proper voltages required for the match operation are provided. Note that, while the embodiments described below couple low match control line LM to word line control circuit 147, in other embodiments low match control line LM may be maintained at $V_{SS}$. However, when low match control line LM is maintained at $V_{SS}$, the resulting CAM cell array will not have the power savings achieved by floating low match control line LM during idle periods.

Referring to the upper portion of FIG. 3, refresh data register 137A includes a sense amplifier 210 that is connected to bit line B1 to sense the data value stored at node N1 during the read phase of the refresh operation in accordance with known techniques. The sense amplifier then amplifies the sensed data value (e.g., to VCC when a logic "1" is detected, or ground/zero volts when a logic "0" is detected), and the amplified sensed data value is maintained on bit line B1 during the write phase of the refresh operation.

Figure 4:
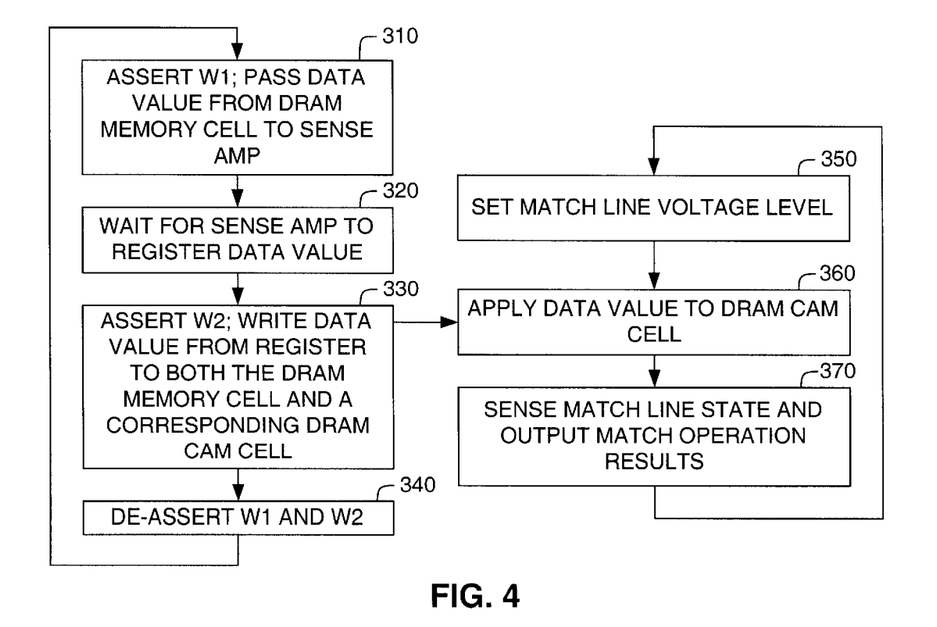
FIG. 4 is a flow diagram showing refresh and match operations that are simultaneously performed by the DRAM CAM array of FIG. 3.

FIG. 4 is a flow diagram showing general steps associated with match and refresh operations of DRAM circuit 110A. The steps shown in the left column of FIG. 4 are associated with a refresh operation, and the steps shown in the right side of FIG. 4 are associated with a match (logic) operation that is performed simultaneously with the refresh operation.

Referring to the left side of FIG. 4 and to the circuit shown in FIG. 3, the refresh operation begins by accessing a selected DRAM memory cell (e.g., DRAM memory cell 115A) in DRAM memory array 110A by asserting word line WL1 coupled to transistor T1 of selected DRAM memory cell 115A (Step 310). Accordingly, turned on transistor T1 passes the data value at storage node N1 of selected DRAM memory cell 115A onto bit line B1. Note that asserted word line WL1 also connects other DRAM memory cells (not shown) in the row including the selected DRAM memory cell to their associated bit lines, which are also registered by associated sense amplifiers.

Next, a predetermined time is allowed for sense amplifier 210 to sense and register the data value transmitted on bit line B1 (Step 320). For example, when sense amplifier 210 senses a logic "1" (which is typically less than VCC due to signal degradation), sense amplifier 210 registers this data value by transmitting a refreshed logic "1" (e.g., VCC) onto bit line B1. Conversely, when sense amplifier 210 senses a logic "0" (which is typically greater than ground/zero volts), sense amplifier 210 registers this data value by transmitting a refreshed logic "0" (e.g., ground or zero volts) onto bit line B1. Note that word line WL1 remains turned on while sense amplifier 210 registers the data value, thereby causing the amplified data value to be written back into selected DRAM memory cell 115A via transistor T1 (i.e., DRAM memory cell 115A is "refreshed"). Note that the amplified data value is transmitted via bit line B1 to DRAM CAM array 120A, where it is also applied inverted bit line B1# (via inverter I1).

Next, word line WL2 is enabled after a predetermined time period designed to allow sense amplifier to register the data value read from DRAM memory cell 115A (Step 320). Enabling word line WL2 turns on transistor T2 and T3, which pass the amplified data value and its inverse to storage node N2 and inverted storage node N2#, respectively.

Finally, after a predetermined set-up period, word lines WL1 and WL2 are de-asserted, thereby turning off transistors T1, T2 and T3, and isolating storage nodes N1, N2 and N2# from bit lines B1 and B1#, respectively (Step 340).

Referring to the right column in FIG. 4, while the refresh operation is repeatedly performed, match (logic) operations are also performed using applied data values transmitted to binary DRAM CAM cell 125A on data lines D1 and D1#. First, match control line M and low match control line LM are pre-charged in the manner described above (Step 350). Next, an applied data value (and its inverse) is transmitted on data line D1 (and inverted data line D1#) (Step 360). A no-match condition is detected when a signal path is opened between match control line M and the low match control line LM. In particular, when the applied data value transmitted on inverted data line D1# and the data value at storage node N2 are both logic "1" (i.e., high) data values, then match control line M is discharged through the turned-on pass transistors T4 and T6, thereby indicating a no-match condition on match control line M. Conversely, a no-match condition is also detected when the applied data value on data line D1 and the inverted data value stored at inverted storage node N2# are both high, thereby discharging match control line M through the turned-on pass transistors T5 and T7. Finally, the charged/discharged state of match control line M is sensed by word line control circuit 147 (see FIG. 2) (Step 370), and the results of the match operation are output through function control circuit 142 (see FIG. 2).

The above refresh operation steps are repeated in accordance with known techniques in order to refresh both the DRAM memory cells in DRAM memory array 110A and the DRAM CAM cells 125A in DRAM CAM array 120A. In addition, logic operation steps 350–370 are performed simultaneously with the refresh operation, thereby providing an efficient DRAM CAM circuit that are not delayed by refresh operations before performing logic operations. Further, DRAM CAM cells 125A are periodically refreshed without being coupled to bit lines B1 and B1# during the read phase of the refresh operation. Accordingly, the present embodiment provides a DRAM CAM circuit that avoids errors caused by reading data during the refresh operation, which is associated with conventional DRAM CAM circuits (discussed above).

In addition to match and refresh operations, DRAM circuit 110A performs read and write operations as follows. Because the data value stored in DRAM memory cell 115A is identical to that stored in DRAM CAM cell 125A, DRAM CAM cell 125A can be read by reading the data value stored in DRAM memory cell 115A (i.e., by enabling word line W1). During write operations, word lines W1 and W2 are simultaneously enabled to write a data value from sense amplifier 210 to both DRAM memory cell 115A and DRAM CAM cell 125A.

Figure 5:
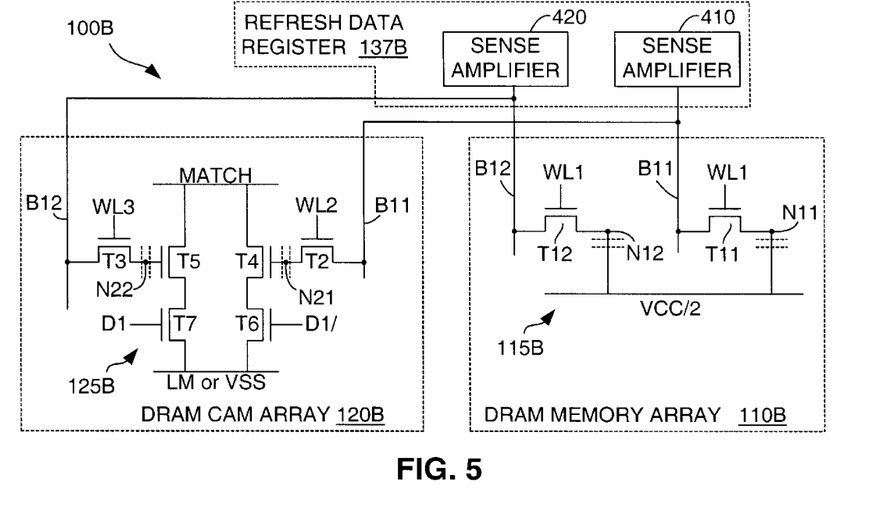
FIG. 5 is a simplified schematic diagram showing a ternary DRAM CAM array according to a second specific embodiment of the present invention.

FIG. 5 is a simplified circuit diagram showing portions of a ternary DRAM circuit 100B in accordance with a second specific embodiment of the present invention. Ternary DRAM circuit 100B includes a DRAM memory (first) array 110B, a ternary DRAM CAM (second) array 120B, a refresh circuit including a refresh data register 137B, and a function circuit (not shown). Portions of DRAM circuit 100B that are not required for explanatory purposes are omitted for brevity.

Referring to the lower right portion of FIG. 5, DRAM memory circuit 110B includes an array of conventional DRAM memory cells 115B (one shown) that are arranged in rows and columns (as shown in FIG. 2). Each DRAM memory cell 115B includes a first transistor T11 that accesses a first storage node N11, and a second transistor T12 that accesses a second storage node N12. Both transistors T11 and T12 having gate terminals connected to an associated word line (e.g., word line WL1). First transistor T11 has a first terminal connected to an associated first bit line B11 and a second terminal connected to a signal source (e.g., VCC/2 or ground). Second transistor T12 also has a first terminal connected to an associated second bit line B12 and a second terminal connected to the signal source.

Referring to the lower left portion of FIG. 5, ternary DRAM CAM array 120B includes an array of DRAM CAM cells 125B (one shown) that are arranged in rows and columns. Each DRAM CAM cell 125B includes transistors T2 through T7, which are described above with reference to DRAM CAM cell 125A of binary CAM array 120A (see FIG. 3). However, DRAM CAM array 120B differs from DRAM CAM array 120A in that distinct bit lines B11 and B12 are supplied to access transistors T2 and T3 (i.e., bit line B12 is not coupled to bit line B11 by an inverter, as in DRAM cam array 120A; see FIG. 3). Accordingly, access transistors T2 and T3, which are controlled by word lines W2 and W3, respectively, pass the two data values read from DRAM memory cell 115B to storage nodes N21 and N22. In another embodiment, word lines W2 and W3 may be implemented using a single word line.

Referring to the upper portion of FIG. 5, refresh data register 137B includes a first sense amplifier 410 that is connected to first bit line B11, and a second sense amplifier 420 that is connected to second bit line B12.

Operation of ternary DRAM CAM circuit 100B is similar to that described above with reference to binary DRAM CAM circuit 100A in that each DRAM CAM cell 125B is refreshed during a write phase of a refresh operation using the two data values read from associated DRAM memory cell 115B during a read phase of the refresh operation. To refresh DRAM CAM cell 125B, data values at storage nodes N11 and N12 are passed to sense amplifiers 410 and 420, respectively, by enabling word line WL1. After sense amplifiers 410 and 420 register the respective data values, word lines WL2 and WL3 are turned on, thereby passing the amplified data values to storage nodes N21 and N22, respectively. Note that word line WL1 remains enabled while word lines WL2 and WL3 are enabled, thereby causing the amplified data values to be written back into selected DRAM memory cell 115A via transistors T11 and T12. Finally, after a predetermined set-up period, word lines WL1, WL2 and WL3 are disabled, thereby isolating storage nodes N11, N12, N21 and N22 from bit lines B11 and B12, respectively.

While the above-described refresh operation is repeatedly performed, data match (logic) operations are also performed using applied data values transmitted to ternary DRAM CAM cell 125B on data lines D1 and D1#. With match control line M and the low match line LM pre-charged in the manner described above, an applied data value (and its inverse) is transmitted on data line D1 (and inverted data line D1#).

The match operation performed by ternary DRAM CAM cell 125B differs from binary CAM cell 125A (see FIG. 3) in that the two data values stored in DRAM memory cell 115B facilitate a "don't care" match operation in DRAM CAM cell 125B. Binary CAM cells, such as DRAM CAM cell 100A (see FIG. 3), store a logic "1" (high voltage) value in at least one of the storage nodes N2 and N2# (i.e., store either 0,1 or 1,0 in storage nodes N2 and N2#, respectively), so one of transistors T4 and T5 is always turned on during a match operation. Ternary CAM cell 125B operates in a similar manner to store logic "1" (e.g., 1,0) and logic "0" (e.g., 0,1) data values, but are also capable of storing a don't care" value in which both storage nodes N21 and N22 of ternary CAM cell 125B store a logic "0". Specifically, when DRAM CAM cell 125B stores either a logic "1" data value or a logic "0" data value, at least one of storage nodes N21 and N22 are held at a high voltage level during the match operation, thereby opening one of transistors T4 and T5, and allowing match control line M to discharge to low match control line LM when the applied data value turns on a corresponding transistor T6 or T7. However, when a "don't care" logic value is transmitted to DRAM CAM cell 125B during the refresh operation, both storage nodes N21 and N22 are maintained at low voltage (e.g., ground) levels, thereby preventing the discharge of match control line M irrespective of the applied data value. Finally, the charged/discharged state of match control line M is sensed by word line control circuit 147 (see FIG. 2), and the results of the match operation are output through function control circuit 142 (FIG. 2).

Figure 6:
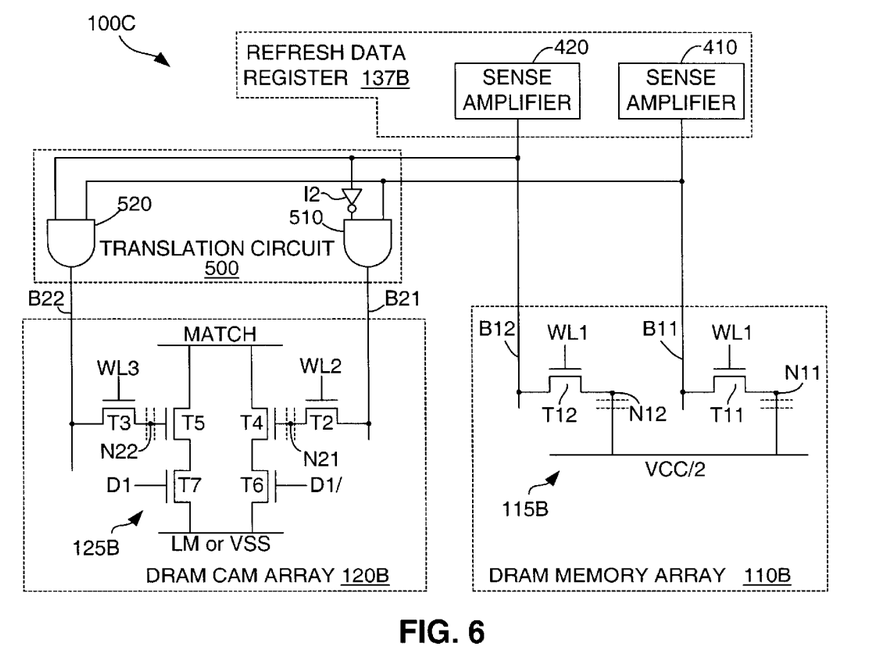
FIG. 6 is a simplified schematic diagram showing a quad DRAM CAM array according to a second specific embodiment of the present invention.

FIG. 6 is a simplified circuit diagram showing portions of a quad (i.e., four state) DRAM CAM circuit 100C in accordance with a third specific embodiment of the present invention. Quad DRAM circuit 100C includes DRAM memory (first) array 110B, quad DRAM CAM (second) array 120B, and refresh data register 137B, which are described above with reference to ternary DRAM CAM circuit 100B (shown in FIG. 5). In addition, quad DRAM CAM circuit 100C includes a translation circuit 500 for translating the data values read from DRAM memory array 110B that are written to DRAM CAM array 120B, thereby supporting the quad CAM cell operation, as described below. As in previous examples, portions of DRAM circuit 100C that are not required for explanatory purposes are omitted for brevity.

In general, quad CAM cells differ from ternary CAM cells in that ternary CAM cells store don't care (e.g., 0,0) data values, whereas quad CAM cells store logic low don't care data values (e.g., 0,0) and logic high don't care data values (e.g., 1,1). These distinct don't care values allow a quad CAM cell to retain a logic value (logic "1" or logic "0") even though it is designated as "don't care" during match operations. For example, referring to DRAM CAM cell 125B, a logic high value (e.g., 1,0) stored at nodes N21 and N22 will turn on transistor T4 (transistor T5 remains turned off). If a subsequent logic low data value (e.g., 0,1) is transmitted on data line D1 and inverted data line D1#, then transistor T6 is turned on, discharging match control line M through transistors T4. When a don't care logic value is stored in DRAM CAM cell 125B, both transistors T4 and T5 remain turned off, thereby precluding a no-match condition. However, in quad CAM cells, if the logic high don't care data values (1,1) is written into CAM cell 125B, then both transistors T4 and T5 would be turned on, thereby generating a no-match condition no matter what data value is applied to data lines D and D#.

Translation circuit 500 is provided to avoid the problem associated with storing a logic high don't care data values (1,1) in CAM cell 125B. Specifically, translation circuit 500 includes a first AND gate 510, a second AND gate 520, and an inverter I2 that are connected to bit lines B11 and B12 to translate the data values read from storage nodes N12 and N22 of DRAM memory cell 115B into data values stored at storage nodes N21 and N22 of CAM cell 125B according to Table 1, provided below.

TABLE 1

| N11 | N12 | N21 | N22 |
|-----|-----|-----|-----|
| 0   | 0   | 0   | 0   |
| 1   | 0   | 0   | 0   |
| 1   | 1   | 1   | 0   |
| 0   | 1   | 0   | 1   |

According to the translations provided in Table 1, each time a logic high don't care (1,0) or a logic low (0,0) don't care data value is written to CAM cell 125B, translation circuit 500 converts these data values into don't care (0,0) data value, thereby preventing a no-match condition during the subsequent application of a data value on data lines D and D#. Note that when the logic high don't care or logic low don't care data value is required, this data value is read from DRAM cell 115B via sense amplifiers 410 and 420 using function control circuit 142 (see FIG. 2) using known techniques.

Those of ordinary skill in the art will recognize that the logic performed by translation circuit 500 can be implemented using other types of logic gates and other data values stored in DRAM memory cell 115B. Accordingly, the circuit structure shown in FIG. 5 is merely exemplary, and is not intended to be limiting.

Although the present invention is described with reference to two DRAM arrays formed on a single "chip", the two DRAM arrays (e.g., first DRAM array 110 and second DRAM array 120) can be fabricated separately and then combined using multi-chip module (MCM) packaging. In view of these and other possible modifications, the invention is limited only by the following claims.

What is claimed is:

1. A memory circuit comprising:
   a first array including a first DRAM cell;
   a second array including a second DRAM cell; and
   a refresh circuit connected to the first array and the second array,
   wherein the refresh circuit controls the first array and the second array such that a data value is read only from the first DRAM cell during a read phase of a refresh operation, and
   wherein the refresh circuit controls the first array and the second array such that the stored data value is written to both the first DRAM cell and the second DRAM cell during a write phase of the refresh operation, whereby the second DRAM cell is refreshed without reading the data value from the second DRAM cell during the read phase.

2. The memory circuit according to claim 1, further comprising a function circuit connected to the second array for performing a logic function in accordance with data stored in the second array.

3. The memory circuit according to claim 2, wherein the second array comprises a match control line connected to second DRAM cell, and the function circuit comprises a control circuit for sensing a voltage level on the match control line.

4. The memory circuit according to claim 1, wherein the first DRAM cell comprises a first transistor having a first terminal connected to a bit line, a second terminal connected to a first storage node, and a gate terminal connected to a first word line.

5. The memory circuit according to claim 4, wherein the refresh circuit comprises a sense amplifier connected to the bit line.

6. The memory circuit according to claim 5, wherein the second DRAM cell comprises a second transistor connected between the bit line and a second storage node, wherein a gate terminal of the second transistor is connected to a second word line.

7. The memory circuit according to claim 1, wherein the first DRAM cell comprises:
   a first transistor having a first terminal connected to a first bit line, a second terminal connected to a first storage node, and a gate terminal connected to a first word line; and
   a second transistor having a first terminal connected to a second bit line, a second terminal connected to a second storage node, and a gate terminal connected to the first word line.

8. The memory circuit according to claim 7, wherein the refresh circuit comprises a first sense amplifier connected to the first bit line, and a second sense amplifier connected to the second bit line.

9. The memory circuit according to claim 8, wherein the second DRAM cell comprises a third transistor connected between the first bit line and a third storage node, and a fourth transistor connected between the second bit line and a fourth storage node,
   wherein a gate terminals of the third and fourth transistors are connected to a second word line.

10. The memory circuit according to claim 8, further comprising:
    a translation circuit connected to the first and second bit lines, the translation circuit including at least one logic gate having a first input terminal connected to the first bit line and a second input terminal connected to the second bit line,
    wherein the second DRAM cell comprises a third transistor connected to an output terminal of the logic gate, and a fourth transistor connected between the second bit line and a fourth storage node,
    wherein a gate terminals of the third and fourth transistors are connected to a second word line.

11. A DRAM CAM circuit comprising:
    a CAM array including a plurality of DRAM CAM cells;
    a memory array including a plurality of DRAM memory cells, each DRAM memory cell being associated with a corresponding DRAM CAM cell of the CAM array;
    means for reading data values from the DRAM memory cells; and
    means for writing the data values back to the DRAM memory cells and to the DRAM CAM cells, thereby refreshing the DRAM CAM cells without reading from the DRAM CAM cells.

12. The DRAM CAM circuit according to claim 11, further comprising a function circuit connected to the CAM array,
    wherein the CAM array comprises a match control line connected to the plurality of DRAM CAM cells, and
    wherein the function circuit comprises a control circuit for sensing a voltage level on the match control line.

13. The DRAM CAM circuit according to claim 11, wherein a first DRAM memory cell of the memory array comprises a first transistor having a first terminal connected to a bit line, a second terminal connected to a first storage node, and a gate terminal connected to a first word line.

14. The DRAM CAM circuit according to claim 13, wherein the means for reading and writing comprises a sense amplifier connected to the bit line.

15. The DRAM CAM circuit according to claim 14, wherein a first DRAM CAM cell comprises a second transistor connected between the bit line and a second storage node, wherein a gate terminal of the second transistor is connected to a second word line.

16. The DRAM CAM circuit according to claim 11, wherein a DRAM memory cell of the memory array comprises:
    a first transistor having a first terminal connected to a first bit line, a second terminal connected to a first storage node, and a gate terminal connected to a first word line; and
    a second transistor having a first terminal connected to a second bit line, a second terminal connected to a second storage node, and a gate terminal connected to the first word line.

17. The DRAM CAM circuit according to claim 16, wherein the means for reading and writing comprises a first sense amplifier connected to the first bit line, and a second sense amplifier connected to the second bit line.

18. The DRAM CAM circuit according to claim 16, wherein a DRAM CAM cell of the CAM array comprises a third transistor connected between the first bit line and a third storage node, and a fourth transistor connected between the second bit line and a fourth storage node,
    wherein a gate terminals of the third and fourth transistors are connected to a second word line.

19. A method for refreshing a selected DRAM cell without reading the data value stored in the selected DRAM cell during a read phase of a refresh operation, the method comprising:

addressing a first DRAM cell during the read phase of the refresh operation such that a data value stored by the first DRAM cell is transmitted onto a bit line;

sensing and amplifying the data value transmitted on the bit line; and transmitting the amplified data value to the selected DRAM cell.

20. The method according to claim 19, wherein addressing the first DRAM cell comprises generating a first word line signal that turns on a first pass transistor of the first DRAM cell that is connected between the bit line and a first storage node storing the data value, and wherein transmitting the amplified data value comprises generating a second word line signal that turns on a second pass transistor of the second DRAM cell connected between the bit line and a second storage node.

* * * * *